(12) United States Patent
Wang

(10) Patent No.: US 7,002,255 B2
(45) Date of Patent: Feb. 21, 2006

(54) MULTI-CHIPS STACKED PACKAGE

(75) Inventor: Sung-Fei Wang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 23 days.

(21) Appl. No.: 10/747,127

(22) Filed: Dec. 30, 2003

(65) Prior Publication Data

US 2004/0212064 A1    Oct. 28, 2004

(30) Foreign Application Priority Data

Apr. 23, 2003    (TW)    ............... 92109527 A

(51) Int. Cl.
*H01L 29/40*    (2006.01)

(52) U.S. Cl. .............. 257/777; 257/723; 257/778

(58) Field of Classification Search ........ 257/685, 257/686, 723, 777, 778
See application file for complete search history.

(56) References Cited

U.S. PATENT DOCUMENTS 5,323,060 A * 6/1994 Fogal et al. ............. 257/777
5,977,640 A * 11/1999 Bertin et al. ............ 257/777

* cited by examiner

*Primary Examiner*—Roy Potter
(74) *Attorney, Agent, or Firm*—Bacon & Thomas, PLLC

(57) ABSTRACT

A multi-chips stacked package mainly comprises a substrate, a lower chip, an upper chip, an intermediate chip, a plurality of bumps and an encapsulation. Therein, the lower chip is disposed on the substrate; the bumps connect the lower chip and the intermediate chip; the upper chip and the lower chip are electrically connected to the substrate via a plurality of first electrically conductive wires and second electrically conductive wires respectively. The bumps can support the intermediate chip more firmly, so the top of the intermediate chip can be kept in counterpoise and higher than the peak of the first wires. Accordingly, the intermediate chip will be prevented from being tilted excessively to cause the upper chip to be contacted to the first electrically conductive wires. Thus, the first electrically conductive wires can be prevented from being damaged when the upper chip is wire bonded to the substrate.

11 Claims, 2 Drawing Sheets

MULTI-CHIPS STACKED PACKAGE

BACKGROUND OF THE INVENTION

1. Field of Invention

This invention relates to a multi-chips stacked package. More particularly, the present invention is related to a multi-chips stacked package with an intermediate chip for preventing an upper chip from being tilted to contact electrically conductive wires and cause said wires to be damaged.

2. Related Art

Recently, integrated circuit (chip) packaging technology is becoming a limiting factor for the development in packaged integrated circuits of higher performance. Semiconductor package designers are struggling to keep pace with the increase in pin count, size limitations, low profile, and other evolving requirements for packaging and mounting integrated circuits.

Due to the assembly package in miniature and the integrated circuits operation in high frequency, MCM (multi-chips module) packages are commonly used in said assembly packages and electronic devices. Usually, said MCM package mainly comprises at least two chips encapsulated therein, for example a processor unit, a memory unit and related logic units, so as to upgrade the electrical performance of said assembly package. In addition, the electrical paths between the chips in said MCM package are short so as to reduce the signal delay and save the reading and writing time.

Generally speaking, conventional MCM packages shall be a multi-chips side-by-side package or a multi-chips stacked package. As shown in FIG. 1, it illustrates a multi-chips stacked package patented in U.S. Pat. No. 5,323,060 to Rich Fogal et al. entitled "Multichip Module Having a Stacked Chip Arrangement" and said stacked package mainly comprises a substrate 110, a lower chip 120 and an upper chip 130. Therein, the upper chip 130 is disposed on the lower chip 120 by wire-bonding and chip-stacking technology, and electrically connected to the substrate 110. Specifically, the U.S. Pat. No. 5,323,060 is characterized in that an adhesive layer 140 is interposed between the lower chip 120 and the upper chip 130 so as to provide a clearance or a gap for wires 150 bonding the lower chip 120 to the substrate 110. Namely, the bonding wires 150 can be accommodated in the clearance or the gap. In addition, the thickness of the adhesive layer 140 shall be larger than the distance between the active surface of the lower chip 120 and the loop height of the bonding wires 150 so as to prevent the upper chip 130 contacting the wires 150. Generally speaking, the adhesive layer 140 is epoxy or tape. However, it is difficult to provide a uniform adhesive layer with an eight (8) mils thickness. It should be noted that when the upper chip 130 is larger than the lower chip 110 in size and the upper chip is electrically connecting to the substrate 110 via wires 150, the upper chip 130 is tilted to contact the wires 150 so as to cause the wires 150 to be damaged due to larger wire-bonding force and the difficulty in controlling the thickness of the adhesive layer 140.

Accordingly, another multi-chips stacked package is provided as shown in FIG. 2. Said package is characterized in that an intermediate chip 160 is interposed between the lower chip 120 and the upper chip 140 through two adhesive layers 162 and 164. The adhesive layers 162 and 164 are made of thermosetting epoxy. Although, the intermediate chip 160 can define a clearance to provide the lower chip 162 enough space for wire-bonding the lower chip 162 to the substrate 110. However, when the bonding wires 150 are bonded the upper chip 130 to the substrate 110 by a larger wire-bonding force, not only the adhesive layer 164 between the upper chip 130 and the intermediate chip 160 but also the adhesive 162 between the lower chip 120 and the intermediate chip 160 is more difficult to control. Accordingly, the upper chip 130 will be more easily tilted so as to cause the wires 150 for connecting the lower chip 120 and the substrate 110 to be damaged.

Therefore, providing another assembly package to solve the mentioned-above disadvantages is the most important task in this invention.

SUMMARY OF THE INVENTION

In view of the above-mentioned problems, an objective of this invention is to provide a multi-chips stacked package with an intermediate chip being not tilted to contact electrically conductive wires and cause said wires to be damaged.

To achieve the above-mentioned objective, a multi-chips stacked package is provided, wherein the multi-chips stacked package mainly comprises a substrate, an upper chip, a lower chip, an intermediate chip, a plurality of bumps and an encapsulation. Therein, the lower chip is disposed on the substrate; the intermediate chip is mounted to the lower chip via bumps; the upper chip is disposed on the intermediate chip and electrically connected to the substrate via wires. The intermediate chip is mounted to the lower chip through bumps and bumps have a better capability than adhesive to support the upper chip, so the top of the intermediate chip will be higher than the peak of the bonding wires. Accordingly, the upper chip can be prevented from contacting the bonding wires due to the tilt of the intermediate chip when the bonding wires are bonded the upper chip to the substrate.

Next, another multi-chips stacked package is provided, wherein the multi-chips stacked package mainly comprises a substrate, an upper chip, a lower chip, an intermediate chip, a plurality of first bumps and second bumps, and an encapsulation. Therein, the lower chip is disposed on the substrate and electrically connected to the substrate via first wires; the intermediate chip is mounted to the lower chip via first bumps; the upper chip is disposed on the intermediate chip via second bumps and electrically connected to the substrate via second wires. The intermediate chip is mounted to the lower chip through bumps; the upper chip is mounted to the intermediate chip through bumps; and said bumps have a better capability than adhesive to support the upper chip or the intermediate chip, so the top of the intermediate chip or the bottom of the upper chip will be higher than the peak of the bonding wires. Accordingly, the upper chip can be prevented from contacting the bonding wires due to the tilt of the intermediate chip when the bonding wires are bonded the upper chip to the substrate. Moreover, an encapsulation is provided to enclose the chips to prevent from being moisturized.

In summary, this invention is related to a multi-chips stacked package with bumps interposed between the upper chip and the intermediate chip or bumps interposed between the intermediate chip and the lower chip. Thus, the upper chip or intermediate chip can be prevented from being tilted and being contacted the wires due to the bumps with a better capability to support the upper chip or the intermediate chip. Moreover, an encapsulation is provided to enclose the chips to prevent from being moisturized.

BRIEF DESCRIPTION OF THE DRAWINGS

The invention will become more fully understood from the detailed description given herein below illustrations only, and thus are not limitative of the present invention, and wherein.

DETAILED DESCRIPTION OF THE INVENTION

The multi-chips stacked package according to the preferred embodiment of this invention will be described herein below with reference to the accompanying drawings, wherein the same reference numbers refer to the same elements.

Figure 3:
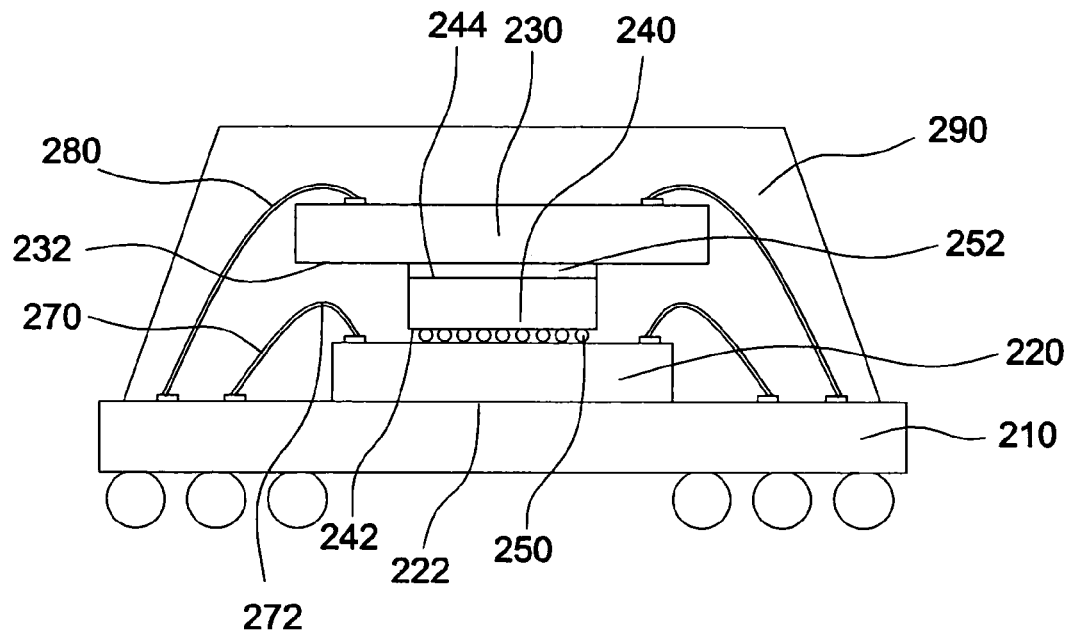
FIG. 3 is a cross-sectional view of a multi-chips stacked package according to the first embodiment.

In accordance with a first preferred embodiment as shown from FIG. 3, there is provided a multi-chips stacked package. The multi-chips stacked package mainly comprises a substrate 210, a lower chip 220, an upper chip 230, an intermediate chip 240, a plurality of first bumps 250 and an encapsulation 260. Therein, the back surface 222 of the lower chip 220 faces the substrate 210 and the lower chip 220 is electrically connected to the substrate 210 through a plurality of first electrically conductive wires 270. Moreover, the bottom 242 of the intermediate chip 240 is mounted to the active surface 224 of the lower chip 220 through first bumps 250. The back surface 232 of the upper chip 230 is attached onto the top 244 of the intermediate chip 240 through an adhesive 252, and the upper chip 230 is electrically connected to the substrate 210 through second electrically conductive wires 280.

Figure 1:
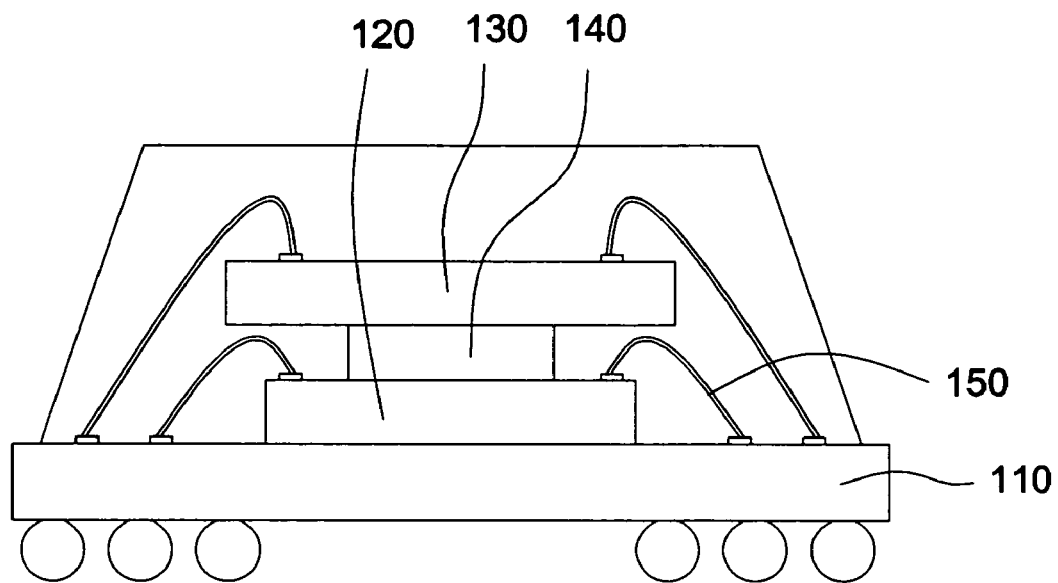
FIG. 1 is a cross-sectional view of the conventional multi-chips stacked package.
Figure 2:
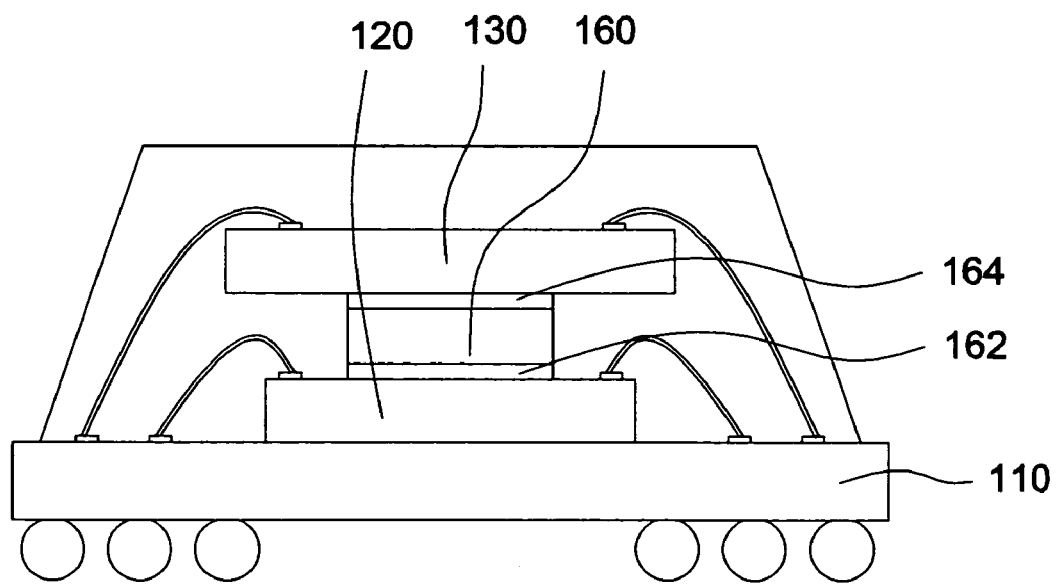
FIG. 2 is a cross-sectional view of another conventional multi-chips stacked package.

As shown in FIG. 2, in a conventional multi-chips stacked package, the intermediate chip 160 is interposed between the upper chip 130 and the lower chip 110 by disposing the adhesive layer 162 between the lower chip 110 and the intermediate chip 160 and disposing the adhesive layer 164 between the upper chip 130 and the intermediate chip 160. When the bonding wires are bonded the upper chip 130 to the substrate 110, the wire-bonding force will be transmitted to the intermediate chip 160 so as to have the intermediate chip 160 tilted and cause the upper chip 130 to be contacted the first wires 170 due to larger wire-bonding force. In this invention, the adhesive layer 162 is replaced by the first bumps 250 so as to have intermediate chip 240 being not tilted excessively and kept in counterpoise due to the stiffness of the first bumps 250. Thus, the upper chip 230 will be more easily kept in counterpoise as the intermediate chip and will not contact and destroy electrically conductive wires 270.

As shown above, when the first bumps 250 are solder bumps, the first bumps 250 can be easily controlled for that the solder bumps are formed by the method of disposing solder paste on the bonding pads of the wafer and reflowing process. Moreover, the solder bumps can be formed by disposing solder balls on the pads of the wafer. Accordingly, the assembly process can be controlled more precisely. In addition, disposing gold bumps on the bonding pads of the wafer is also a simple way to precisely control the assembly process. However, the intermediate chip 240 is not only a dummy chip to provide the upper chip 220 a space for wire bonding to the substrate 210 but also a functional chip to be integrated with another chips enclosed in the same encapsulation to upgrade the electrical performance of the package. As mentioned above, when the intermediate chip 240 is a functional one, the first bumps 250 can electrically connect the intermediate chip 240 and the lower chip 220.

Figure 4:
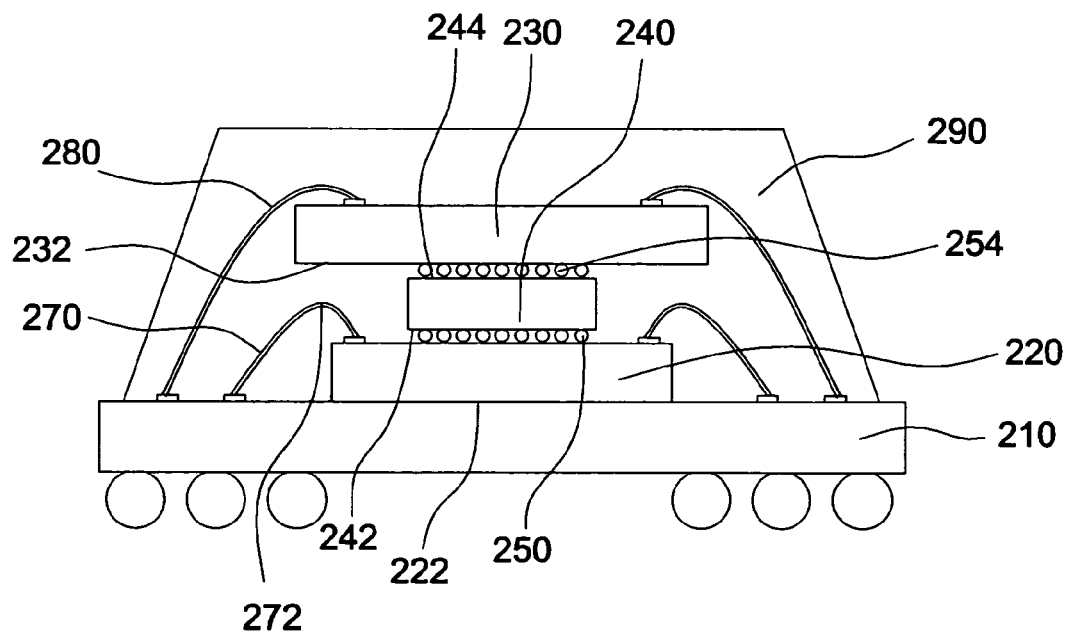
FIG. 4 is a cross-sectional view of a multi-chips stacked package according to the second embodiment.

Besides, a second preferred embodiment is provided as shown in FIG. 4. Therein, another bumps 254 are provided between the intermediate chip 240 and the upper chip 230 so as to replace the adhesive layer 164 as shown in FIG. 2 and provide more space to prevent the upper chip 230 from being tilted excessively. Thus, the first electrically conductive wires 270 can be prevented from being damaged when the first wires 270 are bonded the upper chip 230 to the substrate 210.

As mentioned above, when the intermediate chip 240 is a functional chip, the bumps 254 can be dummy bumps. Namely, the dummy bumps are not electrically connected to the intermediate chip 240. Therein, the dummy bumps can be formed by the following steps. Firstly, a redistributed layer is formed on the back surface of the chip by the method of photolithography, etching and sputter so as to form a plurality of dummy pads on the back surface. Next, the bumps 254 are formed by the method of directly mounting solder balls on the dummy pads, plating or screen-printing solder paste on the dummy pads and then performing a reflowing process. Accordingly, the back surface 232 of the upper chip 230 or the top of the intermediate chip 240 is higher than the peak 272 of the first wire 270 so as to prevent the upper chip 230 from being tilted excessively and destroying the first wires 270. It should be noted that the package further comprises an encapsulation 290 enclosing the lower chip 220, the upper chip 230, the intermediate chip 240, the first electrically conductive wires 270, the second electrically conductive wires 280 and the first bumps 250 so as to prevent the lower chip 220 and the upper chip 230 from being moisturized. Furthermore, a plurality of solder balls 212 are further provided on the lower surface of the substrate 210 to electrically connect the package and external devices. As mentioned above, the intermediate chip is supported by the first bumps and the upper chip is supported by the second bumps, so the intermediate chip and the upper chip will be supported well due to the stiffness of the bumps, and the upper chip and the intermediate chip will be easily kept in counterpoise.

Although the invention has been described in considerable detail with reference to certain preferred embodiments, it will be appreciated and understood that various changes and modifications may be made without departing from the spirit and scope of the invention as defined in the appended claims.

What is claimed is:

1. A multi-chips stacked package, comprising:

a substrate having an upper surface;

a lower chip having a first active surface and a first back surface, wherein the lower chip is disposed on the upper surface of the substrate and electrically connected to the substrate via a plurality of first electrically conductive wires;

an intermediate chip having a top and a bottom, wherein a plurality of first bumps are formed on the bottom and connect the bottom of the intermediate chip and the first active surface of the lower chip, the intermediate chip is a dummy chip; and an upper chip having a second active surface and a second back surface, wherein the upper chip is disposed on the top of the intermediate chip and electrically connected to the substrate via a plurality of second electrically conductive wires.

2. The multi-chips stacked package of claim 1, wherein the second back surface of the upper chip is higher than the peak of the first wires.

3. The multi-chips stacked package of claim 1, wherein the top of the intermediate chip is higher than the peak of the first wires.

4. The multi-chips stacked package of claim 1, wherein the intermediate chip is electrically connected to the lower chip.

5. The multi-chips stacked package of claim 1, wherein the first bumps are gold bumps.

6. The multi-chips stacked package of claim 1, wherein the first bumps are solder bumps.

7. The multi-chips stacked package of claim 1, wherein an adhesive layer is interposed between the second back surface of the upper chip and the top of the intermediate chip.

8. The multi-chips stacked package of claim 1, further comprising a second bump disposed between the second back surface of the upper chip and the top of the intermediate chip.

9. The multi-chips stacked package of claim 8, wherein the second bump is a dummy bump.

10. The multi-chips stacked package of claim 1, further comprising an encapsulation enclosing the lower chip, the upper chip, the intermediate chip, the first electrically conductive wires, the second electrically conductive wires and the first bumps.

11. The multi-chips stacked package of claim 1, further comprising a plurality of solder balls formed on the lower surface of the substrate.

* * * * *